(12) United States Patent
Adams

(10) Patent No.: US 9,531,341 B2
(45) Date of Patent: Dec. 27, 2016

(54) METHOD AND APPARATUS FOR CONVERTING SINGLE-ENDED SIGNALS INTO DIFFERENTIAL SIGNALS

(75) Inventor: Neil Adams, Thoiry (FR)

(73) Assignee: Keysight Technoloiges, Inc., Santa Rosa, CA (US)

( * ) Notice: Subject to any disclaimer, the term of this patent is extended or adjusted under 35 U.S.C. 154(b) by 120 days.

(21) Appl. No.: 14/342,221

(22) PCT Filed: Aug. 30, 2011

(86) PCT No.: PCT/US2011/049683
§ 371 (c)(1),
(2), (4) Date: Aug. 18, 2014

(87) PCT Pub. No.: WO2013/032443
PCT Pub. Date: Mar. 7, 2013

(65) Prior Publication Data
US 2015/0035609 A1  Feb. 5, 2015

(51) Int. Cl.
*H03H 7/42* (2006.01)
*H03F 1/56* (2006.01)
*H03H 11/32* (2006.01)
*H03M 3/04* (2006.01)
*H03H 7/46* (2006.01)

(52) U.S. Cl.
CPC ............... *H03H 7/42* (2013.01); *H03F 1/565* (2013.01); *H03H 11/32* (2013.01); *H03M 3/04* (2013.01); *H03F 2200/09* (2013.01); *H03F 2200/541* (2013.01)

(58) Field of Classification Search
CPC ........................... H03H 7/42; H03F 2200/391
USPC .............. 333/25, 26, 172; 330/301; 327/355
See application file for complete search history.

(56) References Cited

U.S. PATENT DOCUMENTS

| | | | |
|---|---|---|---|
| 4,527,117 A | 7/1985 | Morgan et al. | |
| 4,555,809 A | 11/1985 | Carlson | |
| 5,726,603 A * | 3/1998 | Chawla | H03F 1/301 330/269 |
| 6,064,872 A * | 5/2000 | Vice | H03D 7/14 333/119 |
| 6,154,376 A | 11/2000 | Dan-Harry | |
| 6,727,482 B2 | 4/2004 | Bassill et al. | |
| 6,798,268 B2 * | 9/2004 | Kim | H03D 7/1441 327/359 |
| 7,327,301 B2 * | 2/2008 | Tamba | H03F 3/26 327/77 |
| 7,616,045 B2 * | 11/2009 | Vice | H03D 7/1441 327/355 |

(Continued)

FOREIGN PATENT DOCUMENTS

EP  0393070 B1  10/1988

OTHER PUBLICATIONS

International Preliminary Report on Patentability mailed Mar. 13, 2014 for International Application No. PCT/US2011/049683.

(Continued)

*Primary Examiner* — Dean Takaoka

(57) ABSTRACT

An electronic apparatus comprises a first stage that functions as a single-ended to differential converter for signals in a low frequency range and a second stage that is electrically connected to the first stage and functions as a single-ended to differential converter for signals in a high frequency range.

23 Claims, 4 Drawing Sheets

(56) References Cited

U.S. PATENT DOCUMENTS

| | | | |
|---|---|---|---|
| 7,688,146 B2* | 3/2010 | Kao | H03F 1/223 |
| | | | 330/277 |
| 7,843,272 B2* | 11/2010 | Yamaguchi | H03F 1/22 |
| | | | 330/292 |
| 7,847,653 B2 | 12/2010 | Meharry | |
| 2014/0253242 A1* | 9/2014 | Youssef | H03F 1/08 |
| | | | 330/278 |

OTHER PUBLICATIONS

International Search Report and Written Opinion mailed Apr. 18, 2012 for International Patent Application No. PCT/US2011/049683.

* cited by examiner

METHOD AND APPARATUS FOR CONVERTING SINGLE-ENDED SIGNALS INTO DIFFERENTIAL SIGNALS

CROSS-REFERENCE TO RELATED APPLICATIONS

The present application is a national stage application under 35 U.S.C. §371 and claims priority under 35 U.S.C. §121 from International Patent Application No. PCT/US2011/049683 filed on Aug. 30, 2011. The entire disclosure of International Patent Application No. PCT/US2011/049683 is specifically incorporated herein by reference.

BACKGROUND

Many electronic systems receive analog input signals through an input interface such as a transducer or probe. Examples of such systems include electronic test equipment, metrology equipment, recording devices, and many others. The analog input signals are generally converted into a digitized form for further analysis and processing. This conversion process is accomplished by an analog to digital converter (ADC).

The analog input signals are usually single-ended signals, but most high performance ADCs require differential signal inputs. Accordingly, before the analog input signals are provided to an ADC, they must be converted from single-ended form to differential form. The most common way to convert single-ended signals into differential signals is through the use of a balun transformer.

A balun transformer can convert high-frequency single-ended signals into differential signals without introducing significant distortion. However, a balun transformer cannot operate at low frequencies, so it cannot be used in systems requiring broadband signal conversion. As a result, many ADCs are designed to ignore signals at lower frequency ranges and to function only at higher frequency ranges. Such ADCs are commonly referred to as alternating current (AC) coupled or intermediate frequency (IF) ADCs.

Due to the limits of balun transformers, electronic systems requiring full spectrum single-ended to differential conversion typically rely on a commercially available or custom-built differential-in differential-out amplifier. Such amplifiers can be DC coupled to perform conversion in a frequency range between direct current (DC) and high frequency (HF).

Unfortunately, differential-in differential-out amplifiers tend to introduce noise and distortion across the full frequency range, even if they do not perform amplification, i.e., they have a gain of one. In addition, these amplifiers may present additional design difficulties because they often have output common mode voltage requirements that are different from input common mode voltage requirements of the ADC. Further, these amplifiers include active components, so may consume an undesirable amount of power.

In view of the above shortcomings of conventional techniques and technologies, new approaches are needed for converting single-ended signals into differential signals. In particular, new approaches are needed to provide broadband single-ended to differential conversion with reduced noise, distortion, and power consumption.

SUMMARY

According to a representative embodiment, an electronic apparatus comprises: a first stage that functions as a single-ended to differential converter for signals in a low frequency range; and a second stage that is electrically connected to the first stage and functions as a single-ended to differential converter for signals in a high frequency range.

According to another representative embodiment, a method of operating an electronic apparatus comprising a first stage and a second stage is disclosed. The method comprises: performing single-ended to differential conversion on low-frequency signals in the first stage and transmitting high frequency signals through the first stage without single-ended to differential conversion; and performing single-ended to differential conversion on high-frequency signals in the first stage and transmitting low frequency signals through the first stage without single-ended to differential conversion.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF EMBODIMENTS

Figure 1:
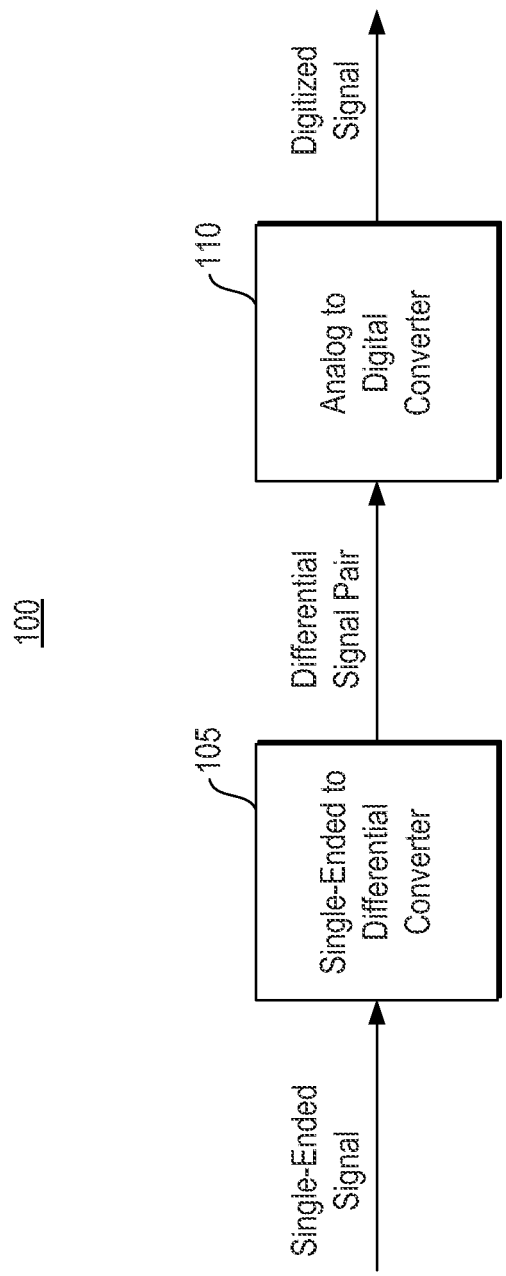
FIG. 1 is a block diagram illustrating an input stage of an electronic system according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion. For example, the terms "isolation" or "separation" are not to be interpreted to require a complete lack of interaction between the described features.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The described embodiments relate generally to conversion of single-ended signals into differential signals. Certain embodiments are capable of performing the conversion across a wide range of frequencies, from DC to HF, with reduced noise and power consumption compared with conventional approaches.

In certain embodiments, single-ended to differential signal conversion is performed by a circuit comprising two stages. The first stage functions as a single-ended to differential signal converter for signals in a low frequency range, and it functions as a through circuit path for signals in a high frequency range. The second stage functions as a single-ended to differential signal converter for signals in the high frequency range, and it functions as a through circuit path for signals in the low frequency range. The first and second stages also function in concert to perform single-ended to differential conversion on signals in a transition frequency range between the low and high frequency ranges.

FIG. 1 is a block diagram illustrating an input stage of an electronic system 100 according to a representative embodiment.

Referring to FIG. 1, the input stage comprises a single-ended to differential signal differential signal converter 105 and an ADC 110. Differential signal differential signal converter 105 receives an analog input signal in a single-ended form and converts the analog input signal into a differential signal pair. Differential signal converter 105 outputs the differential signal pair to ADC 110, which then converts the differential signal pair into a digitized signal.

Electronic system 100 can be any type of system that receives a single-ended input signal and converts it into a differential signal pair. For example, electronic system 100 can be a test and measurement system, a metrology system, or a recording system, to name but a few.

The single-ended signal can be provided to differential signal converter 105 through any of various input interfaces capable of transmitting single-ended signals. For example, it can be provided through an electrical signal probe, a transducer, or an internal transmission line.

Although the embodiment of FIG. 1 combines differential signal converter 105 with ADC 110, differential signal converter 105 could alternatively provide a differential signal pair to other components. In other words, differential signal converter 105 is not limited to performing conversion for the input of an ADC. In addition, although differential signal converter 105 performs conversion on an analog input signal it is not limited to analog signals.

Differential signal converter 105 can perform single-ended to differential conversion across a wide range of frequencies, from DC to HF. In addition, it can perform conversion on high frequency signals without employing active components, avoiding noise that may be introduced by the use of active components.

Figure 2:
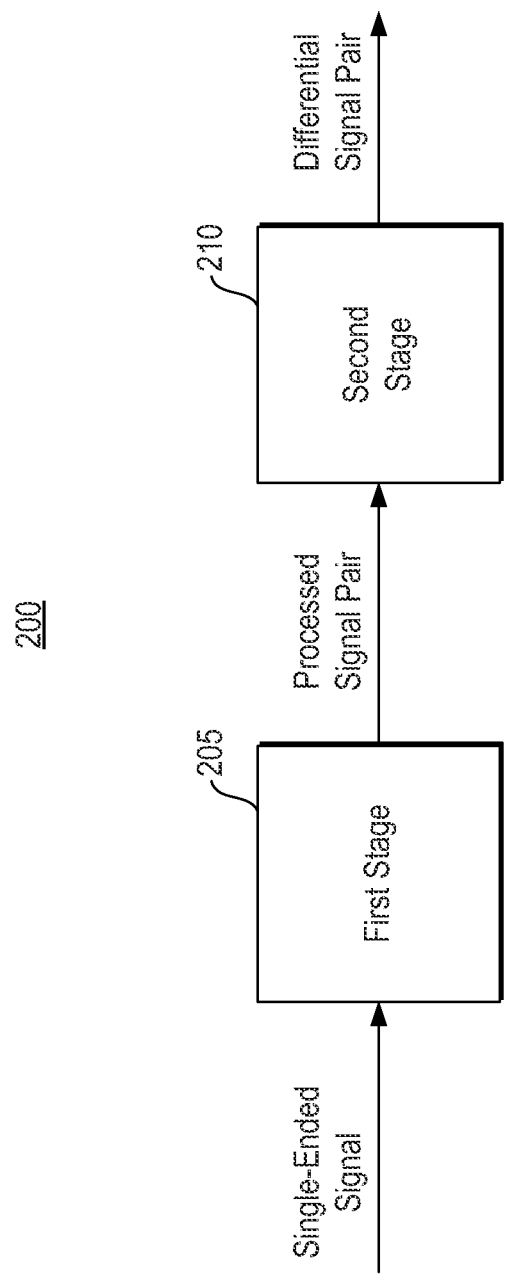
FIG. 2 is a conceptual block diagram illustrating the operation of a single-ended to differential converter in the input stage shown in FIG. 1 according to a representative embodiment.

FIG. 2 is a conceptual block diagram of single-ended to differential converter 200 according to a representative embodiment. Differential converter 200 represents one possible implementation of differential signal converter 105 shown in FIG. 1.

Referring to FIG. 2, differential converter 200 comprises a first stage 205 and a second stage 210, arranged in sequence. This sequential arrangement is shown for convenience, and the stages could be alternatively configured to operate in a different order, including a non-sequential order.

First stage 205 receives a single-ended signal and outputs a processed signal pair. It functions as a single-ended to differential signal converter for input signals in a low frequency range, and it functions as a through circuit path for input signals in a high frequency range. For example, where the single-ended signal is a high frequency signal, the processed signal pair includes the high frequency signal and a ground signal. Otherwise, where the single-ended signal is a low frequency signal, the processed signal pair includes a differential signal pair corresponding to the low frequency signal.

Second stage 210 receives a signal pair that has been processed by first stage 205, and it outputs a differential signal pair. Second stage 210 functions as a single-ended to differential signal converter for signals in the high frequency range, and it functions as a through circuit path for signals in the low frequency range. For example, where the processed signal pair includes a high frequency signal and a ground signal, second stage 210 converts the processed signal pair into a differential signal pair corresponding to the high frequency signal. Otherwise, where the processed signal pair includes a differential signal pair corresponding to a low frequency signal, second stage 210 outputs the processed signal pair without further transformation.

Figure 3:
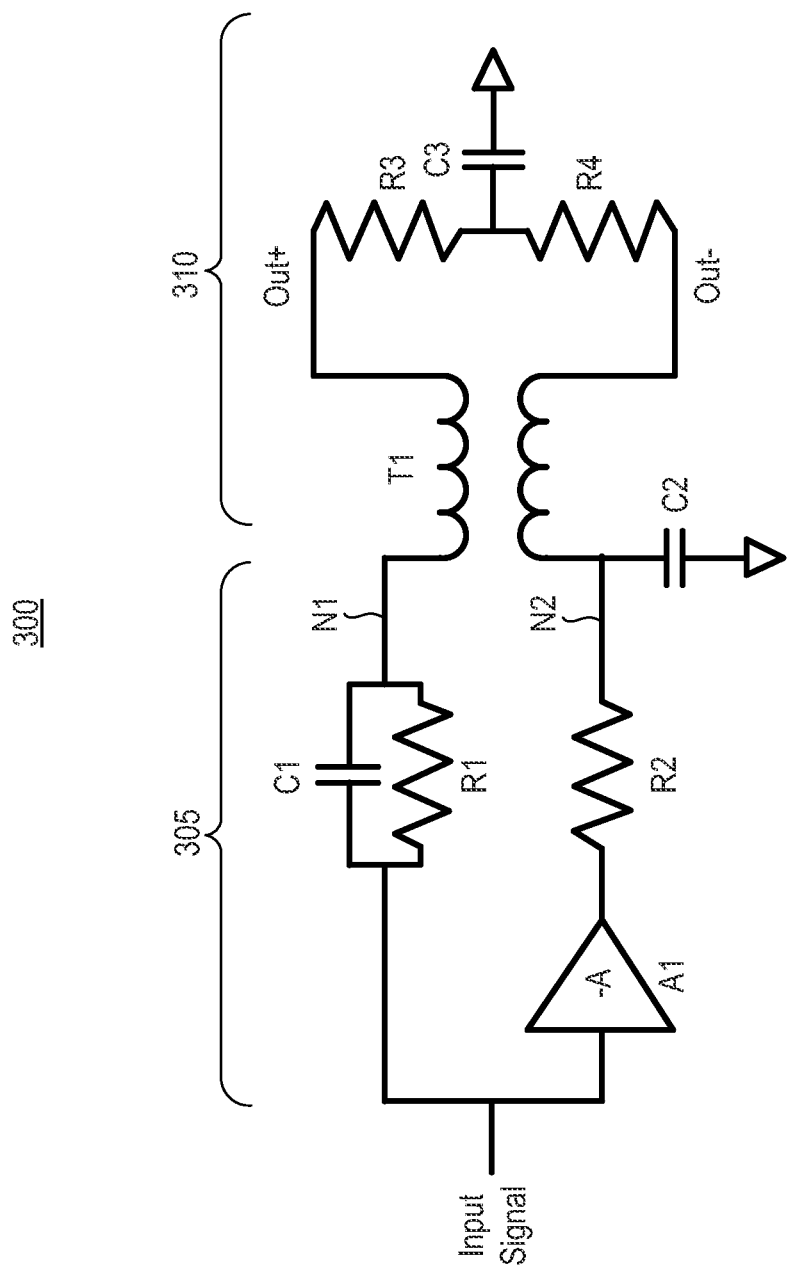
FIG. 3 is a circuit diagram illustrating an example of the single-ended to differential converter of FIG. 2 according to a representative embodiment.

FIG. 3 is a circuit diagram of a single-ended to differential converter 300 according to a representative embodiment. The circuit diagram of FIG. 3 represents one way of implementing the two-part conversion scheme illustrated in FIG. 2.

Referring to FIG. 3, differential converter 300 comprises a first stage 305 and a second stage 310. First stage 305 receives an input signal and transmits it into first and second circuit paths. The first circuit path produces an output signal at a first node N1, and the second circuit path produces an output signal at a second node N2.

The first circuit path comprises a resistor-capacitor pair MICA connected in parallel between the input signal and first node N1. Accordingly, first node N1 can be referred to as an output node of the resistor-capacitor pair R1/C1. The second circuit path comprises an amplifier A1 having a gain of negative one (−1) and connected in series with a resistor-capacitor pair R2/C2. Resistor R2 and capacitor C2 are connected in series, with node N2 located between them. Accordingly, node N2 can be referred to as an output node of resistor R2. In addition, capacitor C2 has a lower terminal connected to ground.

Second stage 310 receives a processed signal pair apparent at nodes N1 and N2, and passes the processed signal pair through a balun transformer T1 to first and second output terminals Out+ and Out−. The first and second output terminals are connected between a load represented by resistance values R3 and R4, and a capacitance C3. These values correspond to the input impedance and capacitance of the load. For explanation purposes, it will be assumed that the load is an ADC.

For input signals in a high frequency range, first stage 305 functions as a through circuit path and second stage 310 functions as a single-ended to differential converter. In general, the high frequency range is determined by the resistance, capacitance, gain, and inductance values of the components in first and second stages 305 and 310. For instance, a high frequency signal passes through capacitors C1 and C2 and induces a desired voltage across the first and second output terminals. For explanation purposes, it will be assumed that C1=C2 and R1=R2=R3=R4. However, these values can be varied in alternative embodiments.

Where the input signal is a high frequency signal, it passes through capacitor C1 to first node N1, and it passes through capacitor C2 to ground. At this point, balun transformer T1 sees the high frequency signal at node N1 and a ground voltage at node N2. Balun transformer T1 then converts the high frequency signal into a differential signal pair across the first and second output terminals.

Because the high frequency signal is transmitted through the first circuit path without passing through any active components, such as amplifier A1, it does not acquire noise or distortion associated with active components.

For input signals in a low frequency range, first stage 305 functions as a single-ended to differential converter, and second stage 310 functions as a through circuit path. Like the high frequency range, the low frequency range is also determined by the resistance, capacitance, gain, and inductance values of the components in first and second stages 305 and 310. For instance, a low frequency signal does not pass through capacitors C1 and C2, but it passes through the coils of balun transformer T1 as if they were mere wires, without creating an induction voltage across the first and second output terminals.

Where the input signal is a low frequency signal, resistor R1 functions as a voltage divider in the first circuit path of first stage 305, and resistor R2 functions as a voltage divider in the second circuit path of first stage 305. To illustrate this functionality, suppose the input signal is a DC signal with amplitude V0. Looking into the first circuit path, the input signal sees resistances R1 and R3. Because R1 and R3 are equal to each other, the input signal is divided in half at node N1. In other words, a voltage of V0/2 is apparent at node N1. Meanwhile, in the second circuit path, voltage V0 is inverted by amplifier A1 and then divided by resistance R2 so that a voltage of V0/2 is apparent at node N2.

Consequently, first stage 305 converts the DC signal with voltage V0 into a differential signal pair including V0/2 and —V0/2 at nodes N1 and N2. These signals are transmitted through balun transformer T1, which acts as two wires with respect to low frequencies, to first and second output terminals Out+ and Out−.

For input signals in a transition frequency range between the high frequency range and the low frequency range, certain components in first and second stages 305 and 310 do not act in the idealized ways described above. For instance, in the transition frequency range, the coils of balun transformer T1 do not behave similar to wires, and capacitors C1 and C2 do not behave similar to open or closed circuits. Nevertheless, by choosing appropriate values of resistance, capacitance, gain, and inductance for the components of differential converter 300, desired amplitudes and phases can be maintained at the first and second output terminals, and desired input impedance can be maintained for the input signal. A variety of different values can be chosen for these components, as will be apparent to those skilled in the art in view of the present teachings.

Figure 4:
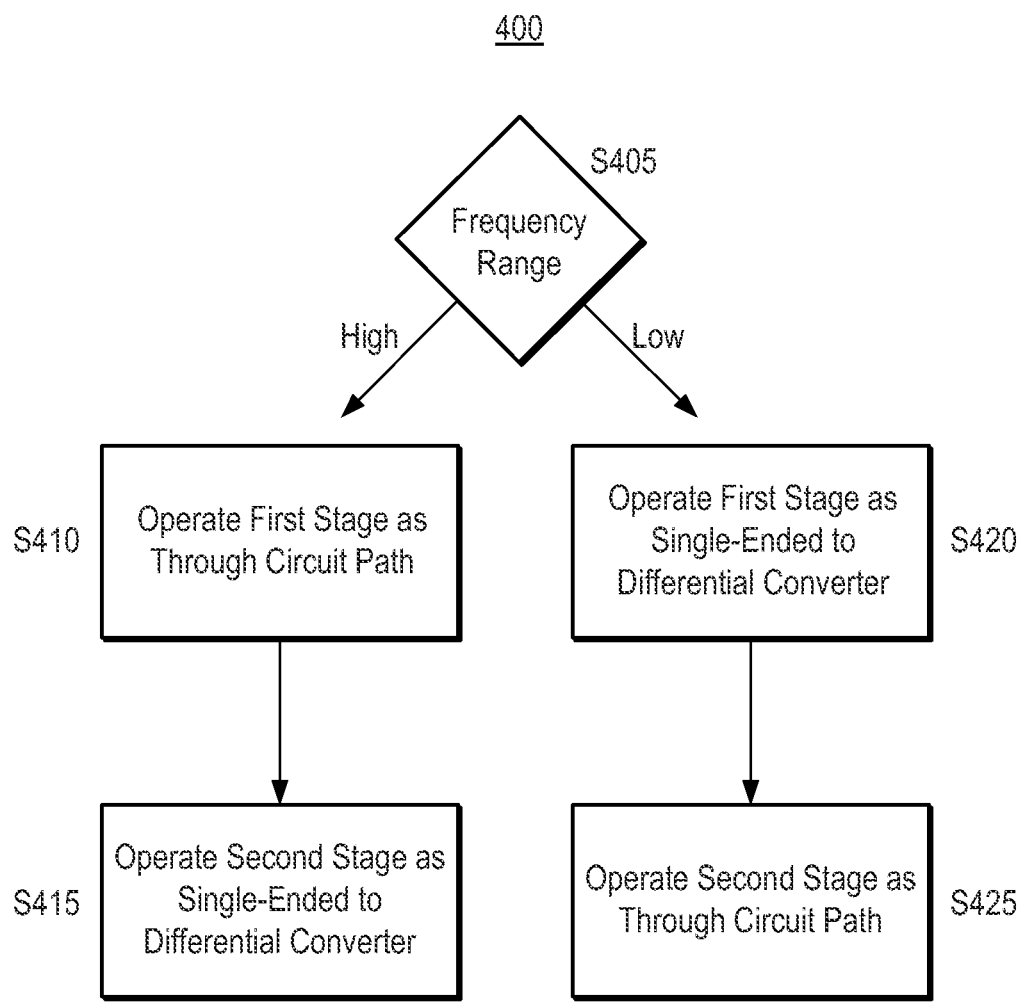
FIG. 4 is a flowchart illustrating a method of converting a single-ended signal into a differential signal pair according to a representative embodiment.

FIG. 4 is a flowchart illustrating a method of converting a single-ended signal into a differential signal pair according to a representative embodiment. For explanation purposes, it will be assumed that the method is performed by differential converter 300 of FIG. 3. However, the method could be performed with various alternative circuit or device configurations. In addition, although the method steps are shown in a logical sequence for illustration purposes, the method does not require these steps to be performed in any particular order. In the description that follows, example method features will be indicated by parentheses (SXXX) to distinguish them from example circuit or device features.

Referring to FIG. 4, the behavior of differential converter 300 is determined by a frequency range of an input signal supplied to differential converter 300 (S405). For signals in a high frequency range (S405=High), first stage 305 operates as a through circuit path (S410), and second stage 310 functions as a single-ended to differential converter (S415). For signals in a low frequency range (S405=Low), first stage 305 operates as a single-ended to differential converter (S420), and second stage 310 functions as a through circuit path (S425).

As indicated by the foregoing, certain embodiments provide proper differential operation over an entire spectrum between DC and HF with a gain of one. All of the higher frequency signals pass via a "passive" balun, which prevents them from experiencing noise and distortion from active components. Meanwhile, only DC and low frequency components pass through active electronic devices, so their contribution to system noise and distortion is greatly reduced. In certain embodiments, a "step-up" type balun is used to get some signal amplification, but other parts of the converter remain as illustrated in FIGS. 2 and 3.

The above embodiments can be implemented using standardized components. Moreover, certain embodiments can be designed to have a flat frequency response from DC to HF, linear phase response, and constant input impedance over frequency. In addition, the above embodiments can generally be designed to meet ADC common mode voltage input requirements more readily than DC coupled differential amplifier solutions.

In various alternative embodiments, the AC and DC paths can be separated out and integrated with a gain stage having two optimized amplifiers—one for DC to medium frequency (MF) and one for MF to HF. This would typically produce better results than using one single amplifier for the whole frequency range.

While example embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. An electronic apparatus, comprising:
    a first stage that functions as a single-ended to differential converter for signals in a low frequency range; and
    a second stage that is electrically connected to the first stage and functions as a single-ended to differential converter for signals in a high frequency range, wherein the first stage functions as a through circuit path for signals in the high frequency range, and the second stage functions as a through circuit path for signals in the low frequency range, the high-frequency signals being transmitted through the first stage without single-ended to differential conversion, wherein low-frequency signals are transmitted through the first stage without single-ended to differential conversion.

2. The electronic apparatus of claim 1, wherein the second stage comprises a balun transformer.

3. The electronic apparatus of claim 2, wherein the balun transformer comprises a first input terminal that receives a first signal apparent at an output node of the first capacitor, and a second input terminal that receives a second signal apparent at an output node of the second resistor.

4. The electronic apparatus of claim 2, wherein the balun transformer is a step-up type balun transformer.

5. An electronic apparatus comprising:
a first stage that functions as a single-ended to differential converter for signals in a low frequency range; and
a second stage that is electrically connected to the first stage and functions as a single-ended to differential converter for signals in a high frequency range, wherein:
the first stage receives an input signal and transmits the input signal through first and second circuit paths;
the first circuit path comprises a first resistor and a first capacitor connected in parallel; and
the second circuit path comprises an inverting amplifier connected in series with a second resistor and a second capacitor connected to ground.

6. The electronic apparatus of claim 5, wherein the second stage comprises a balun transformer.

7. The electronic apparatus of claim 6, wherein the balun transformer comprises a first input terminal that receives a first signal apparent at an output node of the first capacitor, and a second input terminal that receives a second signal apparent at an output node of the second resistor.

8. The electronic apparatus of claim 6, wherein the balun transformer is a step-up type balun transformer.

9. The electronic apparatus of claim 5, wherein the first and second capacitors have substantially the same capacitance, and the first and second resistors have substantially the same resistance.

10. The electronic apparatus of claim 5, further comprising an analog to digital converter (ADC) configured to receive a differential signal input, wherein the first and second resistors have resistance values that are matched to respective input impedances of two input terminals of the ADC.

11. The electronic apparatus of claim 5, wherein the inverting amplifier has a gain of about negative one.

12. An electronic apparatus comprising:
a first stage that functions as a single-ended to differential converter for signals in a low frequency range; and
a second stage that is electrically connected to the first stage and functions as a single-ended to differential converter for signals in a high frequency range, wherein the first stage receives an input signal and outputs a processed signal pair to the second stage, and the second stage receives the processed signal pair and outputs a differential signal pair.

13. The electronic apparatus of claim 12, further comprising an analog to digital converter (ADC) configured to receive a differential signal input, wherein the first and second resistors have resistance values that are matched to respective input impedances of two input terminals of the ADC.

14. An electronic apparatus comprising:
a first stage that functions as a single-ended to differential converter for signals in a low frequency range; and
a second stage that is electrically connected to the first stage and functions as a single-ended to differential converter for signals in a high frequency range, wherein the first stage further comprises an amplifier configured to amplify low frequency signals, and the second stage further comprises an amplifier configured to amplify high frequency signals.

15. The electronic apparatus of claim 14, further comprising an analog to digital converter (ADC) configured to receive a differential signal input, wherein the first and second resistors have resistance values that are matched to respective input impedances of two input terminals of the ADC.

16. An electronic apparatus, comprising:
a balun transformer; and
a low-frequency single-ended to differential converter connected to the balun transformer, wherein
the converter comprises first and second circuit paths connected in parallel, wherein the first circuit path comprises a first resistor and a first capacitor connected in parallel, and the second circuit path comprises an inverting amplifier connected in series with a second resistor and a second capacitor connected to ground.

17. The electronic apparatus of claim 16, wherein the converter is connected to an input side of the balun transformer.

18. The electronic apparatus of claim 16, wherein the balun transformer comprises a first input terminal that receives a first signal apparent at an output node of the first capacitor, and a second input terminal that receives a second signal apparent at an output node of the second resistor.

19. The electronic apparatus of claim 16, wherein the first and second capacitors have substantially the same capacitance, and the first and second resistors have substantially the same resistance.

20. The electronic apparatus of claim 16, further comprising an analog to digital converter (ADC) configured to receive a differential signal input, wherein the first and second resistors have resistance values that are matched to respective input impedances of two input terminals of the ADC.

21. A method of operating an electronic apparatus comprising a first stage and a second stage, the method comprising:
performing single-ended to differential conversion on low-frequency signals in the first stage and transmitting high frequency signals through the first stage without single-ended to differential conversion; and
performing single-ended to differential conversion on high-frequency signals in the first stage and transmitting low frequency signals through the first stage without single-ended to differential conversion.

22. The method of claim 21, further comprising:
performing single-ended to differential conversion on intermediate frequency signals using a combination of components of the first and second stages.

23. The method of claim 21, wherein the first stage comprises first and second circuit paths arranged in parallel, the first circuit path comprising a first resistor and a first capacitor connected in parallel, and the second circuit path comprising an inverting amplifier connected in series with a second resistor and a second capacitor connected to ground; and
wherein the second stage comprises a balun transformer.

* * * * *